(12) United States Patent
Wang et al.

(10) Patent No.: US 10,147,716 B2
(45) Date of Patent: Dec. 4, 2018

(54) ELECTROSTATIC DISCHARGE PROTECTION APPARATUS AND APPLICATIONS THEREOF

(71) Applicant: MACRONIX INTERNATIONAL CO., LTD., Hsinchu (TW)

(72) Inventors: Shih-Yu Wang, Taipei (TW); Ming-Yin Lee, Hsinchu (TW); Wen-Tsung Huang, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 268 days.

(21) Appl. No.: 15/086,119

(22) Filed: Mar. 31, 2016

(65) Prior Publication Data

US 2017/0287895 A1  Oct. 5, 2017

(51) Int. Cl.
*H01L 27/02* (2006.01)
*H02H 9/04* (2006.01)

(52) U.S. Cl.
CPC ........... *H01L 27/0262* (2013.01); *H02H 9/04* (2013.01)

(58) Field of Classification Search
CPC .............................. H01L 27/0262; H02H 9/04
See application file for complete search history.

(56) References Cited

U.S. PATENT DOCUMENTS

| 3,849,902 | A | 11/1974 | Clark, Jr. et al. |
| 6,072,677 | A | 6/2000 | Chen et al. |
| 6,281,527 | B1 | 8/2001 | Chen |
| 6,410,963 | B1 | 6/2002 | Lai et al. |
| 6,476,422 | B1 | 11/2002 | Yu |
| 6,759,691 | B2 * | 7/2004 | Chen .................. H01L 27/0262 257/107 |
| 9,633,992 | B1 | 4/2017 | Huang et al. |
| 9,704,851 | B2 * | 7/2017 | De Raad ............ H01L 27/0262 |
| 2001/0007521 | A1 | 7/2001 | Chen |
| 2002/0079541 | A1 | 6/2002 | Parat et al. |
| 2004/0207020 | A1 | 10/2004 | Chen et al. |
| 2004/0217425 | A1 | 11/2004 | Brodsky et al. |

(Continued)

OTHER PUBLICATIONS

TIPO Office Action dated Oct. 4, 2016 in Taiwan application (No. 105110415).
Office Action dated Oct. 4, 2018 in U.S. Appl. No. 15/941,235.

*Primary Examiner* — Scott Bauer
(74) *Attorney, Agent, or Firm* — McClure, Qualey & Rodack, LLP (57) ABSTRACT

An ESD protection apparatus includes a semiconductor substrate, a first well, a second well, a first doping region, a second doping region, a third doping region and a fourth doping region. The first well and the second well respectively having a first conductivity and a second conductivity are disposed in the semiconductor substrate. The first doping region having the second conductivity is disposed in the first well. The second doping region having the first conductivity is at least partially disposed in the first well and surrounds the first doping region. The third doping region and the fourth doping region respectively having the first conductivity and the second conductivity are disposed in the second well. The first doping region, the third doping region, the first well and the second well are integrated to form a first parasitic BJT and a second parasitic BJT that have different majority carriers.

13 Claims, 10 Drawing Sheets

(56) References Cited

U.S. PATENT DOCUMENTS

| | | |
|---|---|---|
| 2005/0133868 A1 | 6/2005 | Su et al. |
| 2008/0253046 A1* | 10/2008 | Lou .................... H01L 27/0262 |
| | | 361/56 |
| 2011/0147909 A1 | 6/2011 | Hsuan et al. |
| 2013/0026550 A1 | 1/2013 | Yoshioka |
| 2014/0286085 A1 | 9/2014 | Miyakawa |
| 2014/0291765 A1 | 10/2014 | Ouyang et al. |
| 2016/0358904 A1 | 12/2016 | Lin et al. |
| 2017/0170167 A1 | 6/2017 | Jang et al. |
| 2017/0287895 A1 | 10/2017 | Wang et al. |
| 2018/0090482 A1 | 3/2018 | Lee |
| 2018/0096896 A1 | 4/2018 | Zhu |
| 2018/0211950 A1 | 7/2018 | Chiu et al. |
| 2018/0226788 A1 | 8/2018 | Salcedo et al. |

* cited by examiner

ELECTROSTATIC DISCHARGE PROTECTION APPARATUS AND APPLICATIONS THEREOF

BACKGROUND

Technical Field

The disclosure in generally relates to a semiconductor integrated circuit (IC) and the applications thereof, and more particularly to an electrostatic discharge (ESD) protection apparatus and the applications thereof.

Description of the Related Art

An ESD event commonly results from the discharge of a high voltage potential and leads to pulses of high current in a short duration (typically, 100 nanoseconds). Semiconductor IC is vulnerable to ESD events resulted by human contact with the leads of the IC or electrically charged machinery being discharged in other leads of the IC. Accordingly, an ESD protection circuit is essential to a semiconductor IC.

A parasitic silicon controlled rectifier (SCR) is one kind of on-chip semiconductor ESD protection device. Due to its high current sinking/sourcing capability, very low turn-on impedance, low power dissipation, and large physical volume for heat dissipating, parasitic lateral SCR devices have been recognized in the prior art as one of the most effective elements in semiconductor ESD protection circuits.

However, there is a major disadvantage with using the parasitic SCR in ESD protection circuits, the parasitic SCR has a holding voltage far less than its trigger voltage. For example, the holding voltage of a typical parasitic SCR device is about 3.6V. Once the parasitic SCR is triggered under a high-voltage operation (the operation voltage is high than 20V), electrical overstress (EOS) or latch up risk may occur during a subsequent normal operation (the operation voltage is about 2V). In order to reduce the EOS or latch up risk, a conventional approach is applied to increase holding voltage of the parasitic SCR by elongating the distance between the anode and the cathode of the parasitic SCR. But, by this approach, the lay-out size of the semiconductor IC can be increased which does not caught up with the design trends toward scaling down the size of the semiconductor device.

Therefore, there is a need of providing an improved ESD protection apparatus and the applications thereof to obviate the drawbacks encountered from the prior art.

SUMMARY

One aspect of the present disclosure is to provide an ESD protection apparatus, wherein the ESD protection apparatus includes a semiconductor substrate, a first well, a second well, a first doping region, a second doping region, a third doping region and a fourth doping region. The first well and the second well are disposed in the semiconductor substrate, wherein the first well has a first conductivity, and the second well has a second conductivity. The first doping region having the second conductivity is disposed in the first well. The second doping region having the first conductivity is at least partially disposed in the first well and surrounds the first doping region. The third doping region having the first conductivity is disposed in the second well and adjacent to the second doping region. The fourth doping region having the second conductivity is disposed in the second well and adjacent to the third doping region. The first doping region, the first well and the second well are integrated to form a first parasitic bipolar junction transistor (BJT); the third doping region, the first well and the second well are integrated to form a second parasitic BJT; and the first parasitic BJT and the second parasitic BJT have different majority carriers.

Another aspect of the present disclosure is to provide a memory device, wherein the memory device includes an aforementioned ESD protection apparatus and a memory cell array electrically connected to the ESD protection apparatus.

Yet another aspect of the present disclosure is to provide an ESD protection including steps as follows: Firstly an ESD protection apparatus is provided to electrically connecting with an internal circuit. When the internal circuit is subjected to an ESD stress, ESD current is directed to the ground the by the ESD protection apparatus through the first parasitic BJT and the second parasitic BJT.

In accordance with the aforementioned embodiments of the present disclosure, an ESD protection apparatus and applications thereof are provided. The ESD protection apparatus includes at least four doping regions respectively disposed in two doping wells having different conductivities, the doping wells and doping regions are integrated to form a NPN parasitic BJT and a PNP parasitic BJT as well as to configure a parasitic SCR. Wherein, one of the doping regions used to form the anode (or the cathode) is surrounded by a ring-shaped doping region, wherein surrounded doping region and the ring-shaped doping region are disposed in the same doping well and have different conductivities. During a normal operation, the ring-shaped doping region is subjected to a voltage substantially higher than (lower than) or equal to that imposed on the surrounded doping region, whereby the holding voltage of the parasitic SCR can be increased, and the EOS or latch up risk can be moderated.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

The embodiments as illustrated below provide an ESD protection apparatus and applications thereof to moderate the EOS or latch up risk of a parasitic SCR involved in the ESD protection apparatus. The present invention will now be described more specifically with reference to the following embodiments illustrating the structure and arrangements thereof.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

Figure 1A:
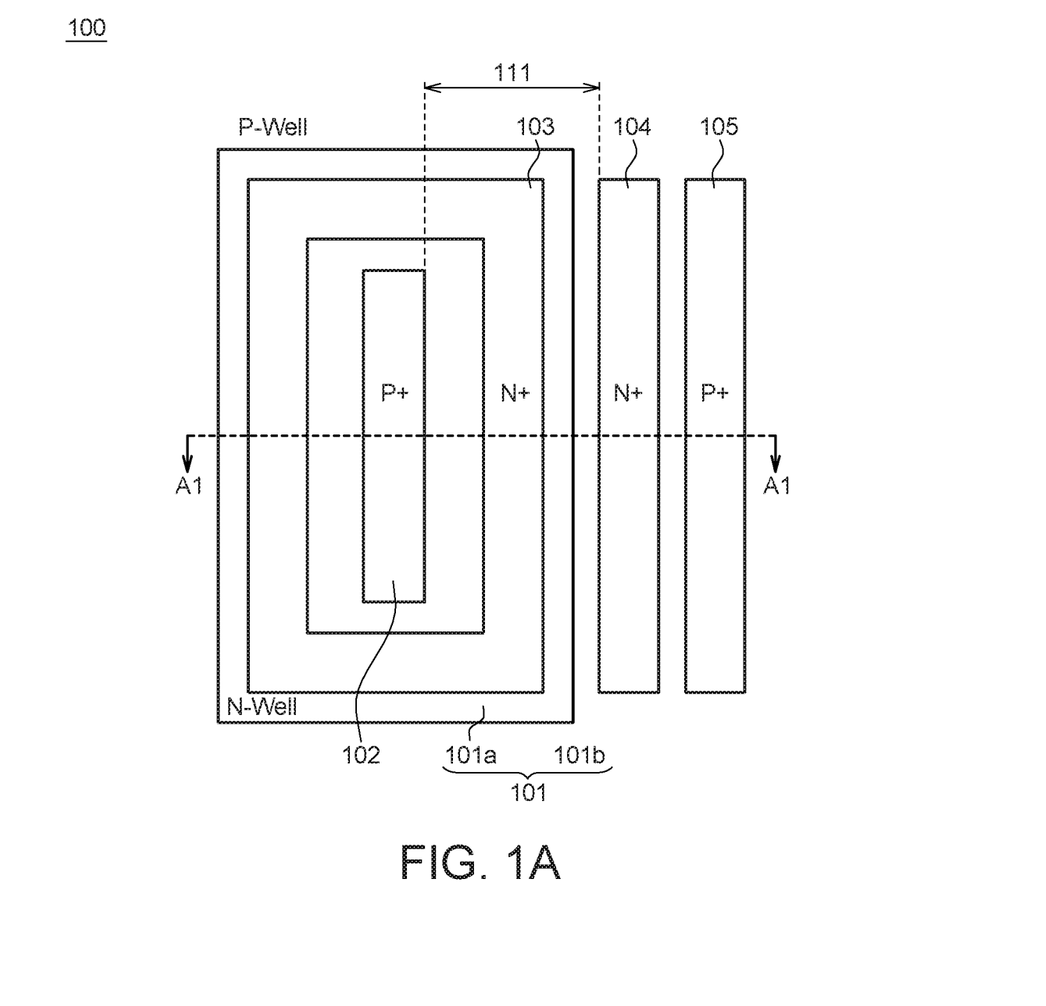
FIG. 1A is a top view illustrating an ESD protection apparatus in accordance with one embodiment of the present invention.
Figure 1B:
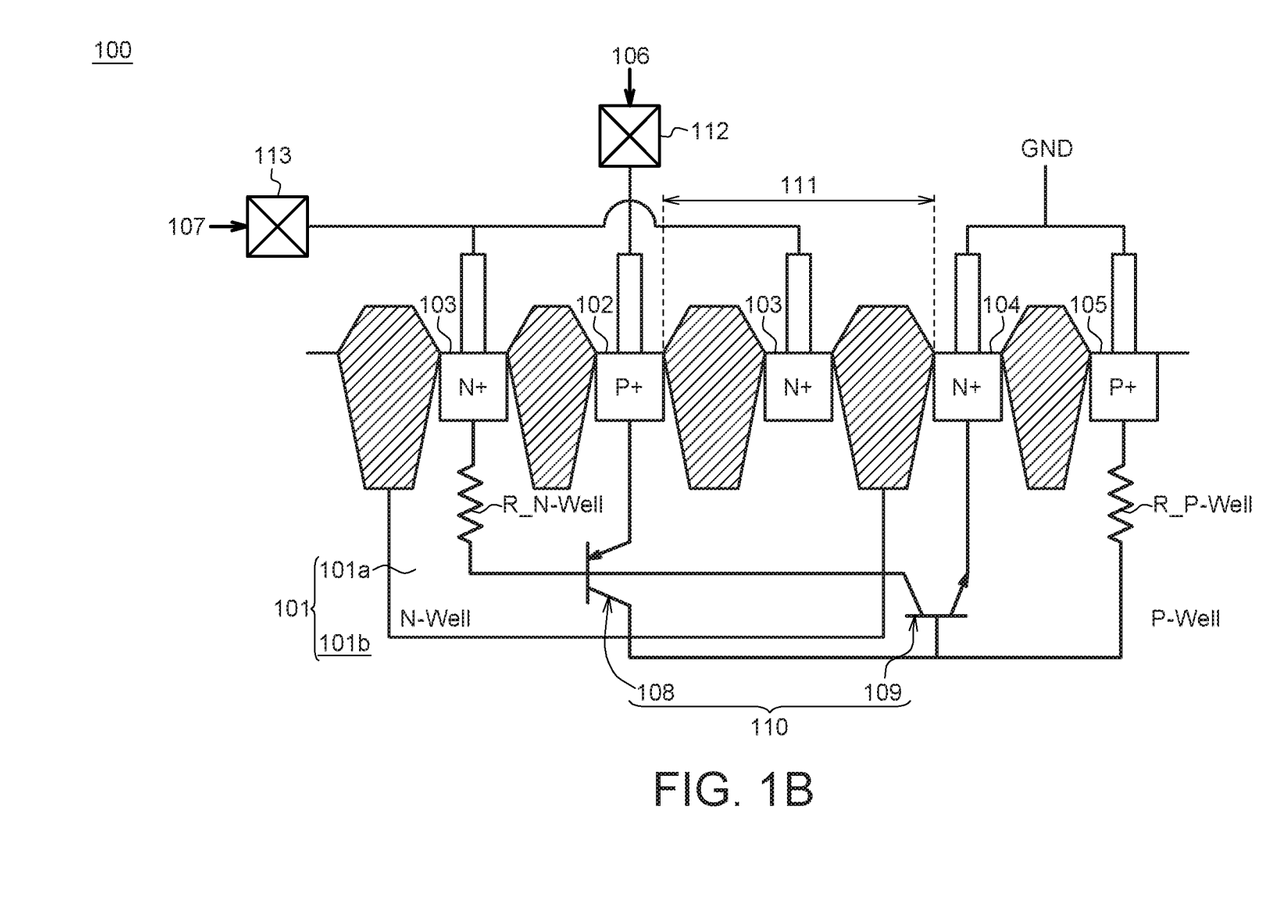
FIG. 1B illustrates a cross-sectional view of the ESD protection apparatus depicted in FIG. 1A taken along the section line A1.

FIG. 1A is a top view illustrating an ESD protection apparatus 100 in accordance with one embodiment of the present invention; and FIG. 1B illustrates a cross-sectional view of the ESD protection apparatus 100 depicted in FIG. 1A taken along the section line A1. The ESD protection apparatus 100 includes a semiconductor substrate 101, a first well 101a, a second well 101b, a first doping region 102, a second doping region 103, a third doping region 104 and a fourth doping region 105.

In some embodiments of the present disclosure, the semiconductor substrate 101 can be made of semiconductor materials (such as silicon (Si), germanium (Ge), and so on), compound semiconductor materials (such as silicon carbide (SiC), gallium arsenide (GaAs), iodine phosphide (IP), phosphide (GaP), iodine arsenide (IAs) and/or iodine antimony (ISb)). In the present embodiment, the semiconductor substrate 101 can be a silicon wafer having a doping well (the first well 101a) with p-type conductivity (also referred to as P-Well) and a doping well (the second well 101b) with n-type conductivity (referred to as N-Well).

The first doping region 102 having p-type conductivity is disposed in the first well 101a and has a doping concentration substantially greater than that of the first well 101a (also referred to as P+). The second doping region 103 having n-type conductivity is disposed in the first well 101a and has a doping concentration substantially greater than that of the first well 101a (also referred to as N+). In addition, in the present embodiment, the second doping region 103 is a ring-shaped doping region surrounding the first doping region 102. The first doping region 102 is connected to a first voltage source 106 through a pad 112; the second doping region 103 is connected to a second voltage source 107 through another pad 113. During a normal operation (the operation voltage is about 2V), the voltage imposed on the second doping region 103 by the second voltage source 107 is substantially greater than or equal to that imposed on the first doping region 102 by the first voltage source 106. In some embodiments of the present disclosure, the voltage imposed on the second doping region 103 may be substantially equal to that imposed on the first doping region 102.

The third doping region 104 having n-type conductivity is disposed in the second well 101b and adjacent to the second doping region 103, as well as has a doping concentration substantially greater than that of the second well 101b (also referred to as N+). The fourth doping region 105 having p-type conductivity is disposed in the second well 101b and adjacent to the third doping region 104, as well as has a doping concentration substantially greater than that of the second well 101b (also referred to as P+). Wherein the third doping region 104 and the fourth doping region 105 are connected to the ground (referred to as GND).

The first doping region 102, the first well 101a and the second well 101b are integrated to form a PNP parasitic BJT 108 having p-type majority carriers; and the third doping region 104, the first well 101a and the second well 101b are integrated to form an NPN parasitic BJT 109 having n-type majority carriers. The collector of the PNP parasitic BJT 108 is connected to the base of the NPN parasitic BJT 109 and the fourth doping region 105; and the base of the PNP parasitic BJT 108 is connected to the collector of the NPN parasitic BJT 109 and the second doping region 103, whereby a parasitic SCR 110 is formed in the semiconductor substrate 101.

The first doping region 102 may serve as the anode of the parasitic SCR 110, and the third doping region 104 may serve as the cathode of the parasitic SCR 110. In some embodiments of the present disclosure, the distance 111 between the anode (first doping region 102) and the cathode (third doping region 104) of the parasitic SCR 110 may substantially range from 3 μm to 7 μm. In the present embodiment, the distance 111 between the anode (first doping region 102) and the cathode (third doping region 104) of the parasitic SCR 110 is about 5.5 μm.

Since the anode (the first doping region 102 with the p-type conductivity) of the parasitic SCR 110 formed in the first well 101a is surrounded by a doping region having opposite conductivity (the second doping region 103 with n-type conductivity) and also formed in the first well 101a, thus the resistance R_N-well of the first well 101a can be reduced. Such that, the PNP parasitic BJT 108 formed in the first well 101a cannot be turn on easily during the normal operation. The holding voltage of the parasitic SCR 110 can be significantly increased. As a result, the EOS or latch up risk can be moderated.

For example, in some embodiments of the present disclosure, the holding voltage of the ESD protection apparatus 100 provided by the embodiments of the present disclosure may range from 5V to 6V. In comparison with the holding voltage (about 2V) of a conventional ESD protection apparatus having similar structure, except that the anode of the conventional one is not surrounded by the doping region with different conductivity, the ESD protection apparatus 100 provided by the embodiments of the present disclosure has greater holding voltage than the conventional one.

Figure 2:
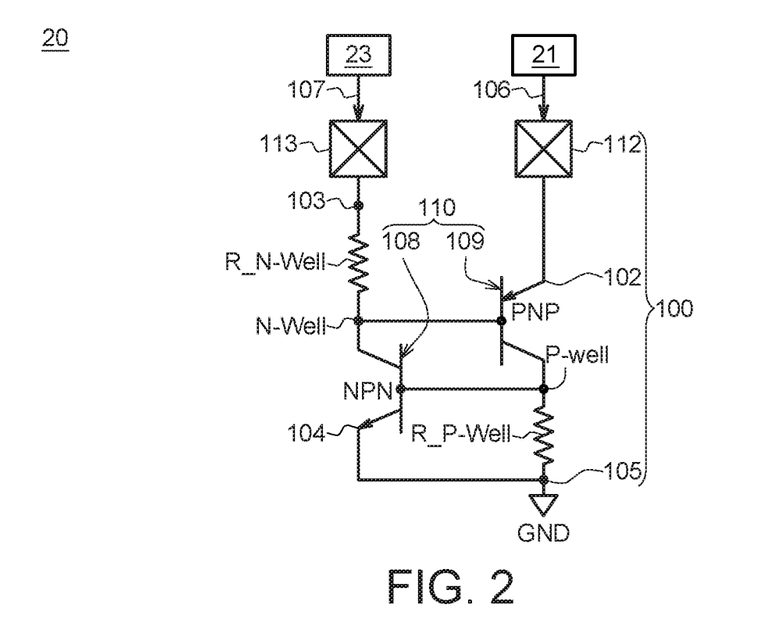
FIG. 2 is a circuit diagram illustrating the layout of a semiconductor IC applying the ESD protection apparatus depicted in FIGS. 1A and 1B.

In some embodiments of the present disclosure, the ESD protection apparatus 100 is used to protect an internal circuit 21 involved in a semiconductor IC 20 from being damaged by ESD current. FIG. 2 is a circuit diagram illustrating the layout of a semiconductor IC 20 applying the ESD protection apparatus 100 depicted in FIGS. 1A and 1B. In the present embodiment, the semiconductor IC 20 can be a memory device, and the internal circuit 21 can be a memory cell array, wherein the internal circuit 21 is electrically connected to the pad 112 of the parasitic SCR 110 of the ESD protection apparatus 100.

When the internal circuit protected by the ESD protection apparatus 100 is subjected to an ESD stress, ESD current may flow into the ESD protection apparatus 100 from the pad 112, passing through the first doping region 102, the PNP parasitic BJT 108, the NPN parasitic BJT 109, and then be directed into the ground GND via the third doping region 104 and the fourth doping region 105. In some embodiments of the present disclosure, during the ESD stress, the second voltage source 107 connected to the second doping region 103 can be remained in a floating state to reduce the trigger voltage of the parasitic SCR 110 and improve the performance of the ESD protection apparatus 100.

Figure 3:
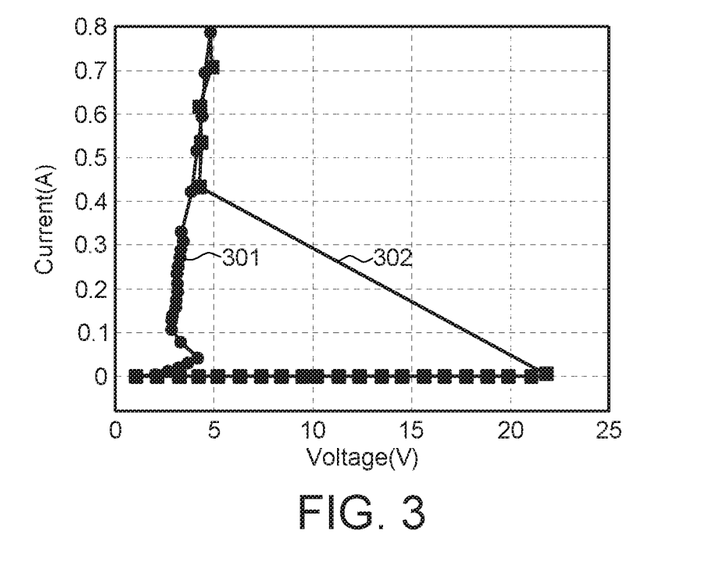
FIG. 3 is a characteristic diagram illustrating the current-voltage characteristic of the ESD protection apparatus depicted in FIGS. 1A and 1B.

FIG. 3 is a characteristic diagram illustrating the current-voltage characteristic of the ESD protection apparatus 100 depicted in FIGS. 1A and 1B. Curve 301 represents the current-voltage characteristic of the ESD protection apparatus 100 of which the second voltage source 107 connected to the second doping region 103 is remained in a floating state during the ESD stress; and Curve 302 represents the current-voltage characteristic of the ESD protection apparatus 100 of which the second voltage source 107 connected to the second doping region 103 is not remained in a floating state during the ESD stress. In FIG. 3, it can be observed the trigger voltage of the ESD protection apparatus 100 can be greater than 20V when the second voltage source 107 connected to the second doping region 103 is not remained in a floating state during the ESD stress, and alternatively can be reduced to less than 5V, when the second voltage source 107 connected to the second doping region 103 is remained in a floating state during the ESD stress.

Figure 4:
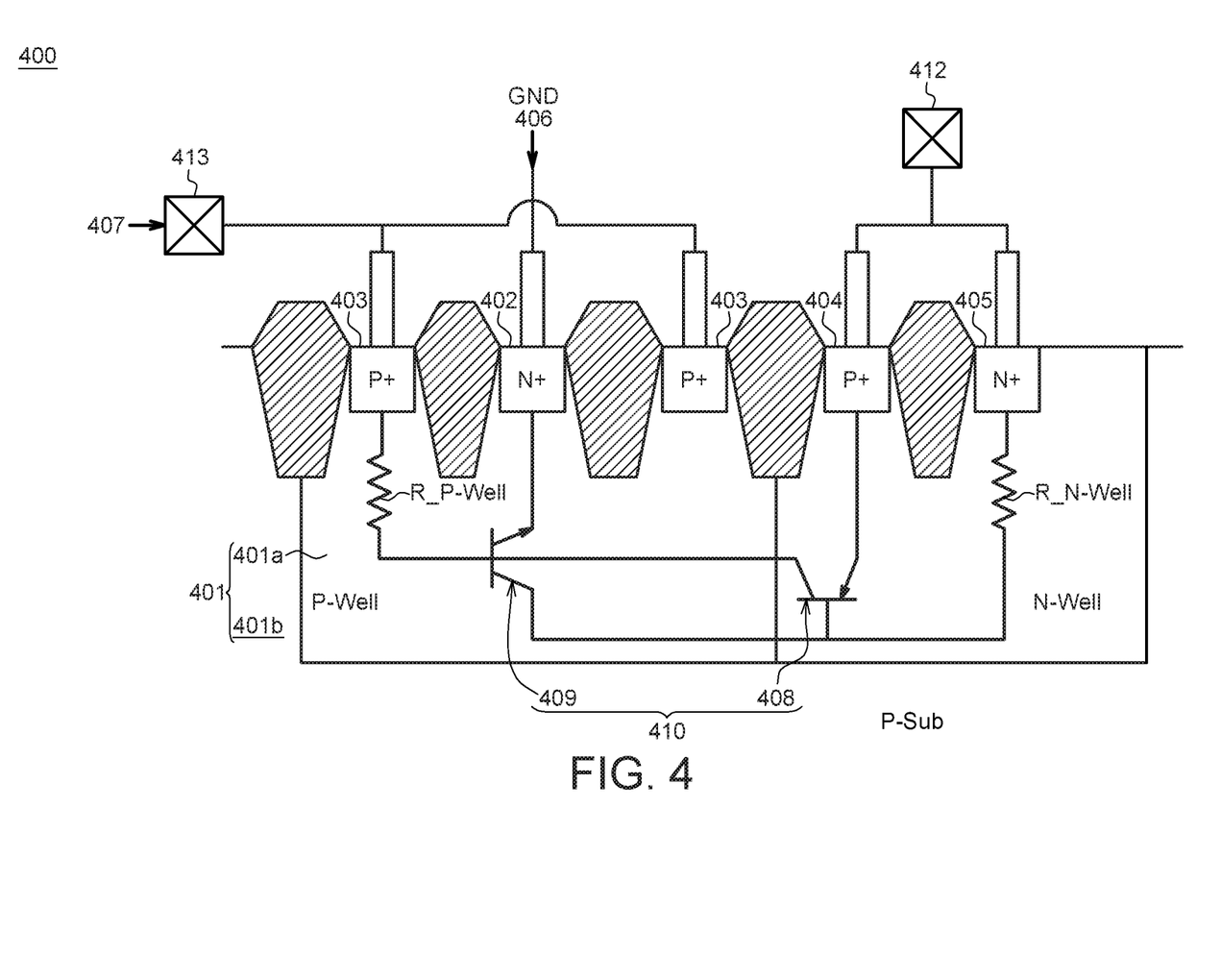
FIG. 4 is a cross-sectional view illustrating an ESD protection apparatus in accordance with another embodiment of the present invention.

FIG. 4 is a cross-sectional view illustrating an ESD protection apparatus 400 in accordance with another embodiment of the present invention. The structure of the ESD protection apparatus 400 is similar to that of the ESD protection apparatus 100 depicted in FIGS. 1A and 1B, except that the conductivities of the semiconductor substrate 101, the first well 101a, the second well 101b, the first doping region 102, the second doping region 103, the third doping region 104 and the fourth doping region 105 are just the reverse of what the semiconductor substrate 401, the first well 401a, the second well 401b, the first doping region 402, the second doping region 403, the third doping region 404 and the fourth doping region 405 have.

In the ESD protection apparatus 400, the first well 401a and the second well 401b are disposed in a p-type substrate P-sub; the first doping region 402, the first well 401a and the second well 401b are integrated to form an NPN parasitic BJT 409 having n-type majority carriers; and the third doping region 404, the first well 401a and the second well 401b are integrated to form a PNP parasitic BJT 408 having p-type majority carriers. The base of the NPN parasitic BJT 409 is connected to the collector of the PNP parasitic BJT 408 and the second doping region 403; and the base of the PNP parasitic BJT 408 is connected to the collector of the NPN parasitic BJT 409 and the fourth doping region 405, whereby a parasitic SCR 410 is formed in the semiconductor substrate 401.

The third doping region 404 may serve as the anode of the parasitic SCR 410, and the first doping region 402 may serve as the cathode of the parasitic SCR 410. The first doping region 402 is connected to a first voltage source 406; the second doping region 403 is connected to a second voltage source 407 through another pad 413. The third doping region 404 and the fourth doping region 405 are connected to a pad 412. During a normal operation, the voltage imposed on the second doping region 403 by the second voltage source 407 is substantially less than or equal to that imposed on the first doping region 402 by the first voltage source 406. In a preferred embodiment, the first voltage source 406 is ground GND.

Since the cathode (the first doping region 102 with n-type conductivity) of the parasitic SCR 110 formed in the first well 101a is surrounded by a doping region having opposite conductivity (the second doping region 403 with p-type conductivity) and also formed in the first well 401a, thus the resistance R_P-well of the first well 401a can be reduced. Such that, the NPN parasitic BJT 409 formed in the first well 401a cannot be turn on easily during the normal operation. The holding voltage of the parasitic SCR 410 can be significantly increased. As a result, the EOS or latch up risk can be moderated.

When the internal circuit (not shown) protected by the ESD protection apparatus 400 is subjected to an ESD stress, ESD current may flow into the ESD protection apparatus 400 from the pad 412, passing through the third doping region 404, the fourth doping region 405, the PNP parasitic BJT 408, the NPN parasitic BJT 409, and then be directed into the ground GND via the first doping region 402. In some embodiments of the present disclosure, the first doping region 402 and the second doping region can both be connected to the ground GNG during the ESD stress.

Figure 5A:
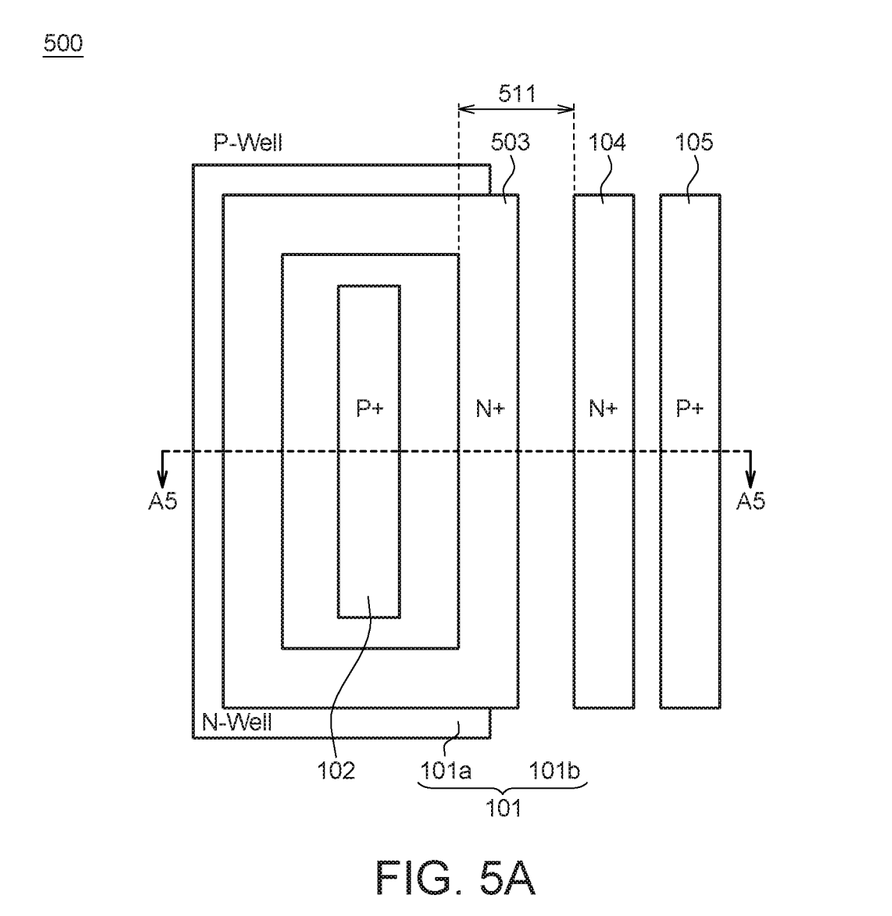
FIG. 5A is a top view illustrating an ESD protection apparatus in accordance with yet another embodiment of the present invention.
Figure 5B:
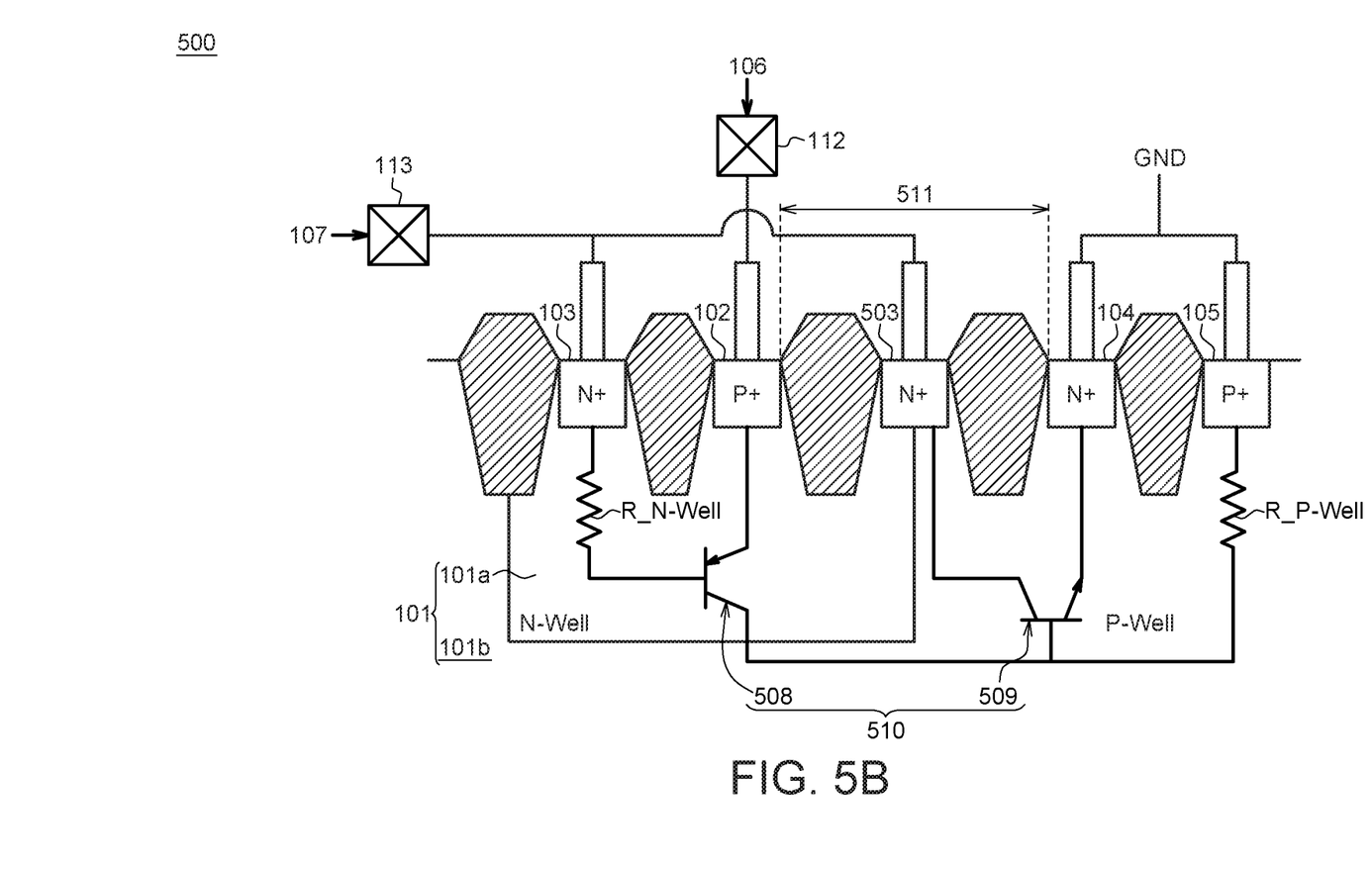
FIG. 5B illustrates a cross-sectional view of the ESD protection apparatus depicted in FIG. 5A taken along the section line A5.

FIG. 5A is a top view illustrating an ESD protection apparatus 500 in accordance with yet another embodiment of the present invention; and FIG. 5B illustrates a cross-sectional view of the ESD protection apparatus 500 depicted in FIG. 5A taken along the section line A5. The structure of the ESD protection apparatus 500 is similar to that of the ESD protection apparatus 100 depicted in FIGS. 1A and 1B, except that a portion of the second doping region 503 is disposed in the second well 101b. As illustrated in FIGS. 5A and 5B, the left half of the second doping region 503 is disposed in the first well 101a; and the right half of the second doping region 503 extends into the second well 101b. By this way, the distance 511 between the anode (first doping region 102) and the cathode (third doping region 104) of the parasitic SCR 510 can be reduced, and the additional volume consumption due to the arrangement of the ring-shaped second doping region 503 can be offset.

Because the NPN parasitic BJT 509 of the parasitic SCR 510 with in the ESD protection apparatus 500 has a N+/P junction formed on the interface of the second doping region 503 and the second well 101b, and in comparison with the ESD protection apparatus 100, the N+/P junction of the ESD protection apparatus 500 has a carriers mobility greater than that of the P/N junction of the NPN parasitic BJT 109 formed on the interface of the first well 101a and the second well 101b of the parasitic SCR 110. The breakdown voltage of the parasitic SCR 510 can be reduced significantly and the performance of the ESD protection apparatus 500 can be improved.

Figure 6A:
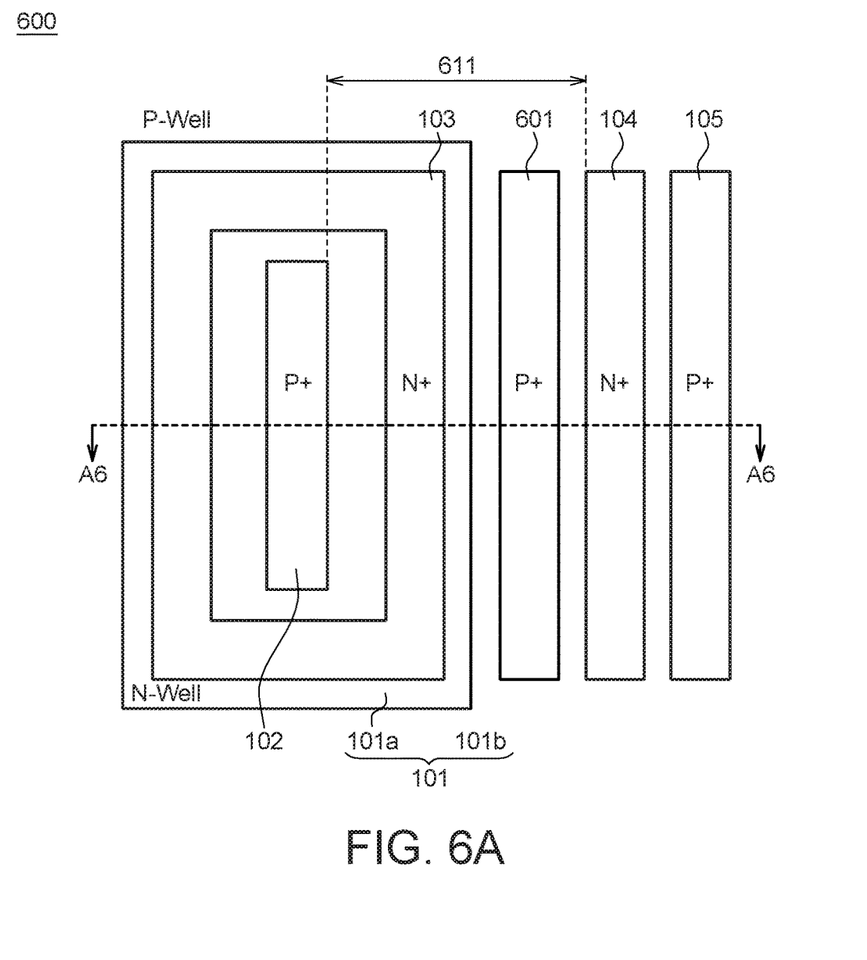
FIG. 6A is a top view illustrating an ESD protection apparatus in accordance with yet another embodiment of the present invention.
Figure 6B:
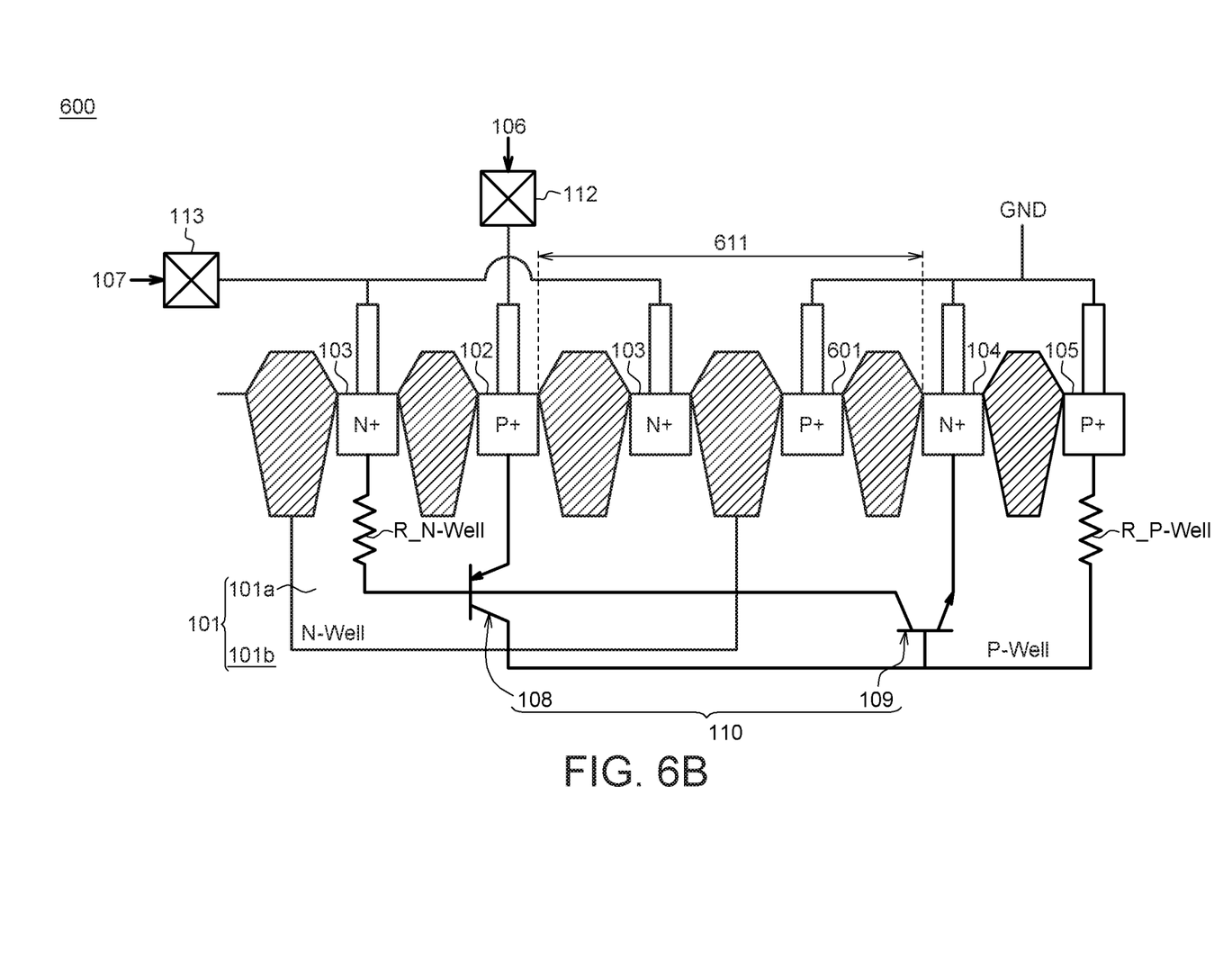
FIG. 6B illustrates a cross-sectional view of the ESD protection apparatus depicted in FIG. 5A taken along the section line A6.

In addition, more doping regions can be arranged between the anode (first doping region 102) and the cathode (third doping region 104) of the parasitic SCR 110. FIG. 6A is a top view illustrating an ESD protection apparatus 600 in accordance with yet another embodiment of the present invention; and FIG. 6B illustrates a cross-sectional view of the ESD protection apparatus 600 depicted in FIG. 5A taken along the section line A6. The structure of the ESD protection apparatus 600 is similar to that of the ESD protection apparatus 100 depicted in FIGS. 1A and 1B, except that there is a fifth doping region 601 disposed between the second doping region 103 and the third doping region 104.

In the present embodiment, the fifth doping region 601 having p-type conductivity is disposed in the second well 101b and has a doping concentration substantially greater than that of the second well 101b (also referred to as P+). Like the third doping region 104 and the fourth doping region 105, the fifth doping region 601 can be connected to the ground GND. However, in some other embodiments, the fifth doping region 601 can be maintained in a floating state (not shown). By the arrangement of the fifth doping region 601 the distance 611 between the anode (first doping region 102) and the cathode (third doping region 104) of the parasitic SCR 110 can be increased, thereby the holding voltage of the parasitic SCR 110 can be increased, and the EOS or latch up risk can be moderated.

Figure 7A:
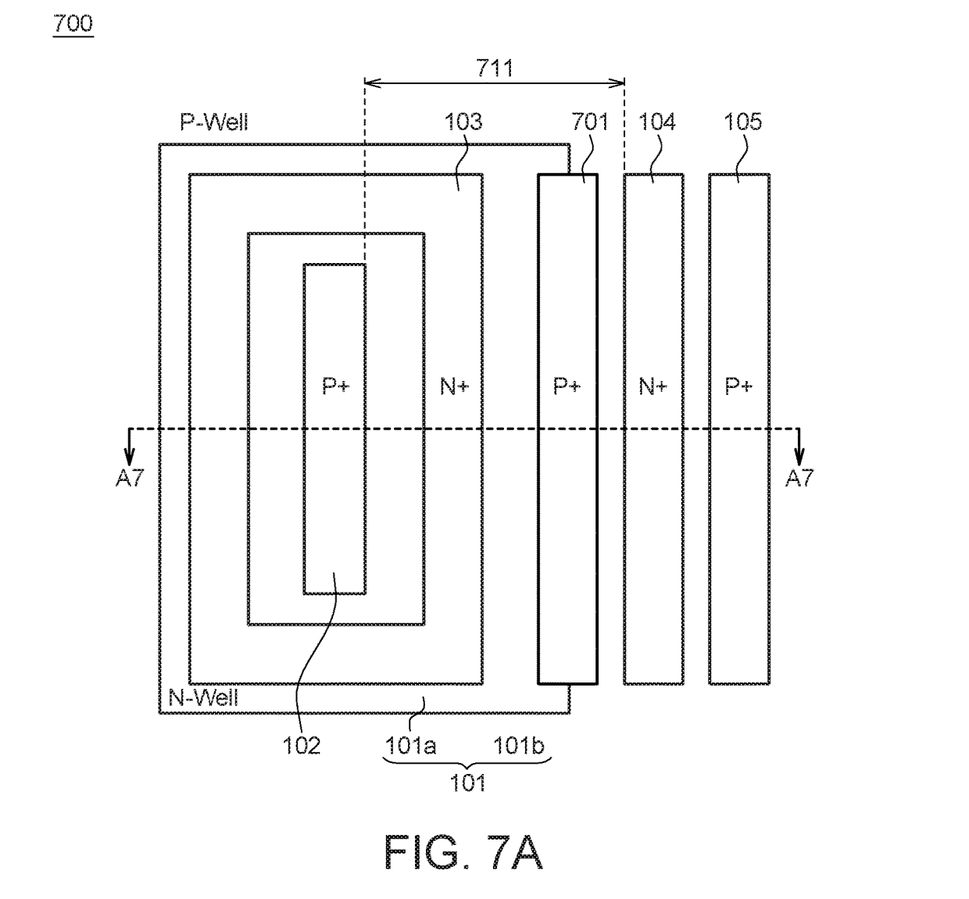
FIG. 7A is a top view illustrating an ESD protection apparatus in accordance with yet another embodiment of the present invention.
Figure 7B:
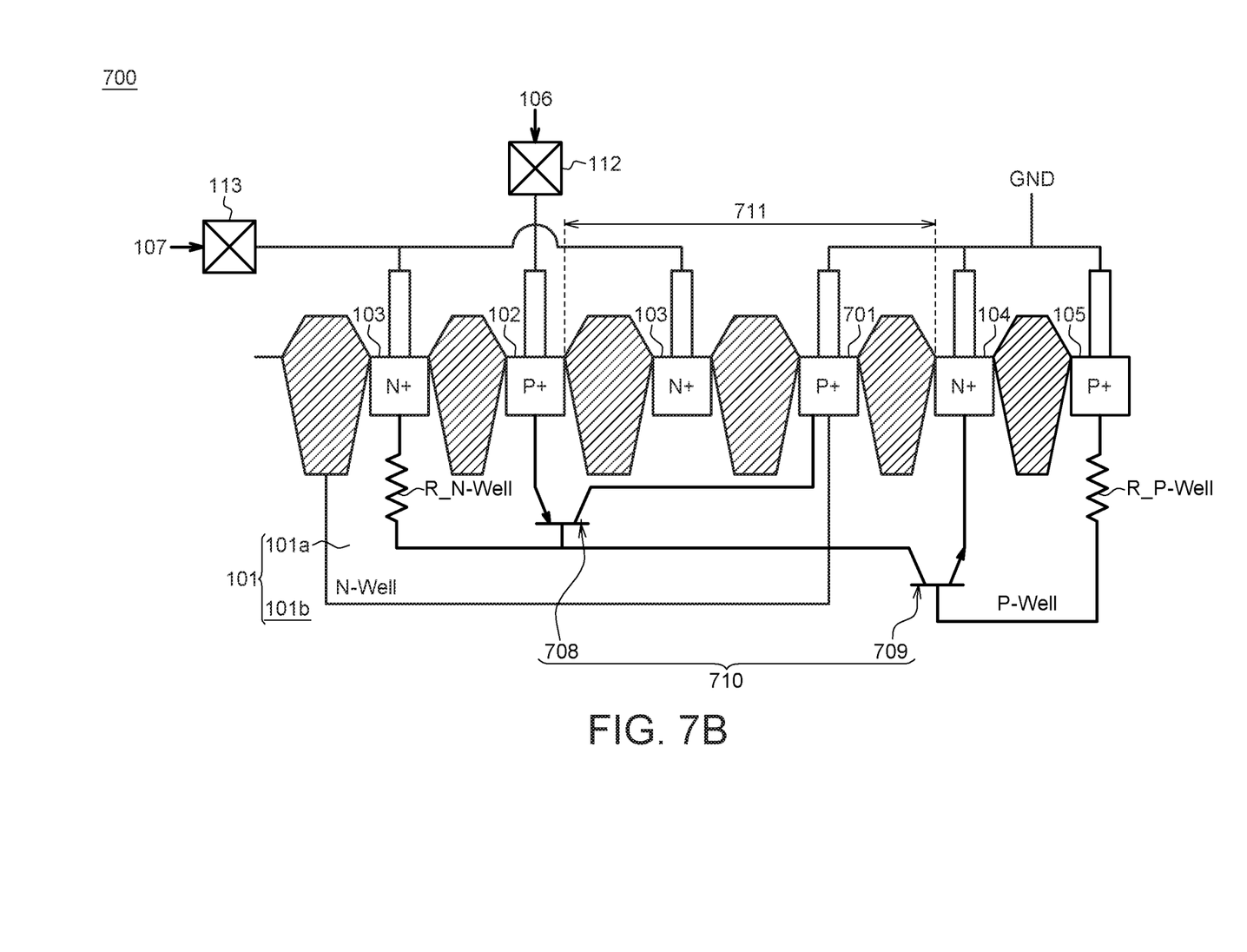
FIG. 7B illustrates a cross-sectional view of the ESD protection apparatus depicted in FIG. 5A taken along the section line A7.

FIG. 7A is a top view illustrating an ESD protection apparatus 700 in accordance with yet another embodiment of the present invention; and FIG. 7B illustrates a cross-sectional view of the ESD protection apparatus 700 depicted in FIG. 5A taken along the section line A7. The structure of the ESD protection apparatus 700 is similar to that of the ESD protection apparatus 600 depicted in FIGS. 6A and 6B, except that the fifth doping region 701 extends both into the first well 101a and the second well 101b. As illustrated in FIGS. 7A and 7B, the right half of the fifth doping region 701 extends into the second well 101b; and the left half of the fifth doping region 701 extends into the first well 101a. By this way, the distance 711 between the anode (first doping region 102) and the cathode (third doping region 104) of the parasitic SCR 110 can be reduced, and the additional volume consumption due to the insertion of the fifth doping region 701 can be offset.

In accordance with the aforementioned embodiments of the present disclosure, an ESD protection apparatus and applications thereof are provided. The ESD protection apparatus includes at least four doping regions respectively disposed in two doping wells having different conductivities, the doping wells and doping regions are integrated to form a NPN parasitic BJT and a PNP parasitic BJT as well as to configure a parasitic SCR. Wherein, one of the doping regions used to form the anode (or the cathode) is surrounded by a ring-shaped doping region, wherein surrounded doping region and the ring-shaped doping region are disposed in the same doping well and have different conductivities. During a normal operation, the ring-shaped doping region is subjected to a voltage substantially higher than (lower than) or equal to that imposed on the surrounded doping region, whereby the holding voltage of the parasitic SCR can be increased, and the EOS or latch up risk can be moderated.

Because the NPN parasitic BJT 709 of the parasitic SCR 710 within the ESD protection apparatus 700 has a P+/N junction formed on the interface of the fifth doping region 701 and the first well 101a, and in comparison with the ESD protection apparatus 100, the P+/N junction of the ESD protection apparatus 700 has a carriers mobility greater than that of the P/N junction of the NPN parasitic BJT 109 formed on the interface of the first well 101a and the second well 101b of the parasitic SCR 110. The breakdown voltage of the parasitic SCR 710 can be reduced significantly and the performance of the ESD protection apparatus 700 can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrostatic discharge (ESD) protection apparatus, comprising:
    a semiconductor substrate;
    a first well having a first conductivity, disposed in the semiconductor substrate;
    a second well having a second conductivity, disposed in the semiconductor substrate
    a first doping region having the second conductivity and disposed in the first well
    a second doping region having the first conductivity, at least partially disposed in the first well, and surrounding the first doping region;
    a third doping region having the first conductivity, disposed in the second well and adjacent to the second doping region;
    a fourth doping region having the second conductivity, disposed in the second well and adjacent to the third doping region; and
    a fifth doping region, a portion of the fifth doping region disposed in the first well and the other portion of the fifth doping region disposed in the second well;
    wherein the first doping region, the first well and the second well are integrated to form a first parasitic bipolar junction transistor (BJT); the third doping region, the first well and the second well are integrated to form a second parasitic BJT; and the first parasitic BJT and the second parasitic BJT have different majority carriers.

2. The ESD protection apparatus according to claim 1, wherein the first conductivity is n-type conductivity, and the second conductivity is p-type conductivity; the first doping region is connected to a first voltage source, the second doping region is connected to a second voltage source, the third doping region and the fourth doping region are connected to the ground, and a voltage imposed on the second doping region by the second voltage source is substantially greater than or equal to that imposed on the first doping region by the first voltage source.

3. The ESD protection apparatus according to claim 1, wherein the first conductivity is p-type conductivity, and the second conductivity is n-type conductivity; the first doping region is connected to a first voltage source, the second doping region is connected to a second voltage source, and a voltage imposed on the second doping region by the second voltage source is substantially less than or equal to that imposed on the first doping region by the first voltage source which is connected to the ground.

4. The ESD protection apparatus according to claim 1, the fifth doping region has the second conductivity disposed between the second doping region and the third doping region, and the fifth doping region is connected to the ground.

5. The ESD protection apparatus according to claim 1, wherein a portion of the second doping region is disposed in the first well and the other portion of the second doping region is disposed in the second well.

6. An ESD protection method, comprising:
    providing an ESD protection apparatus electrically connected to an internal circuit, the ESD protection apparatus comprising:
    a semiconductor substrate;
    a first well having a first conductivity, disposed in the semiconductor substrate;

a second well having a second conductivity, disposed in the semiconductor substrate;

a first doping region having the second conductivity and disposed in the first well;

a second doping region having the first conductivity, at least partially disposed in the first well, and surrounding the first doping region;

a third doping region having the first conductivity, disposed in the second well and adjacent to the second doping region;

a fourth doping region having the second conductivity, disposed in the second well and adjacent to the third doping region; and a fifth doping region, a portion of the fifth doping region disposed in the first well and the other portion of the fifth doping region disposed in the second well;

wherein the first doping region, the first well and the second well are integrated to form a first parasitic bipolar junction transistor (BJT); the third doping region, the first well and the second well are integrated to form a second parasitic BJT; and the first parasitic BJT and the second parasitic BJT have different majority carriers; and when the internal circuit is subjected to an ESD stress, directing ESD current to the ground the by the ESD protection apparatus through the first parasitic BJT and the second parasitic BJT.

7. The method according to claim 6, wherein the first conductivity is n-type conductivity, and the second conductivity is p-type conductivity; the ESD current flows into the ESD protection apparatus through the first doping region, and is directed into the ground via the third doping region and the fourth doping region.

8. The method according to claim 6, further comprising remaining the second doping region in a floating state, when the internal circuit is subjected to the ESD stress.

9. The method according to claim 6, wherein the first conductivity is p-type conductivity, and the second conductivity is n-type conductivity; the ESD current flows into the ESD protection apparatus through the third doping region and the fourth doping region, and is directed into the ground via the first doping region and the second doping region.

10. The method according to claim 6, wherein the first conductivity is n-type conductivity, and the second conductivity is p-type conductivity; the first doping region is connected to a first voltage source, the second doping region is connected to a second voltage source, the third doping region and the fourth doping region are connected to the ground, and a voltage imposed on the second doping region by the second voltage source is substantially greater than or equal to that imposed on the first doping region by the first voltage source.

11. The method according to claim 6, wherein the first conductivity is p-type conductivity, and the second conductivity is n-type conductivity; the first doping region is connected to a first voltage source, the second doping region is connected to a second voltage source, and a voltage imposed on the second doping region by the second voltage source is substantially less than or equal to that imposed on the first doping region by the first voltage source which is connected to the ground.

12. The method according to claim 6, wherein the fifth doping region has the second conductivity disposed between the second doping region and the third doping region, and the fifth doping region is connected to the ground.

13. The method according to claim 6, wherein a portion of the second doping region is disposed in the first well and the other portion of the second doping region is disposed in the second well.

* * * * *